US008874254B2

(12) United States Patent
Iwanaga et al.

(10) Patent No.: US 8,874,254 B2
(45) Date of Patent: Oct. 28, 2014

(54) TEMPERATURE SETTING METHOD OF HEAT PROCESSING PLATE, TEMPERATURE SETTING APPARATUS OF HEAT PROCESSING PLATE, PROGRAM, AND COMPUTER-READABLE RECORDING MEDIUM RECORDING PROGRAM THEREON

(75) Inventors: Shuji Iwanaga, Koshi (JP); Nobuyuki Sata, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 778 days.

(21) Appl. No.: 13/180,278

(22) Filed: Jul. 11, 2011

(65) Prior Publication Data

US 2011/0270465 A1    Nov. 3, 2011

Related U.S. Application Data

(62) Division of application No. 11/721,612, filed as application No. PCT/JP2005/022454 on Dec. 7, 2005, now Pat. No. 8,014,895.

(30) Foreign Application Priority Data

Dec. 13, 2004  (JP) .................................. 2004-360064

(51) Int. Cl.
*G06F 19/00*    (2011.01)
*G05D 23/00*    (2006.01)
(Continued)

(52) U.S. Cl.
CPC .... *H01L 21/67248* (2013.01); *H01L 21/67178* (2013.01); *H01L 21/67103* (2013.01)
USPC ........... 700/153; 700/209; 700/300; 438/502; 438/509; 438/522; 438/530; 438/540; 438/550; 438/660; 438/715; 438/781; 438/799; 219/638; 219/444.1; 219/441; 219/405; 219/448.11; 432/253; 432/12; 432/31; 432/81; 432/258; 62/3.3

(58) Field of Classification Search
USPC .............. 700/153, 209, 300; 62/3.3; 438/502, 438/509, 522, 530, 540, 550, 660, 715, 781, 438/799; 219/638, 444.1, 441, 405, 448.11; 432/253, 12, 31, 81, 258
See application file for complete search history.

(56) References Cited

U.S. PATENT DOCUMENTS

| 4,950,870 A | 8/1990 | Mitsuhashi et al. .......... 219/390 |
| 5,875,416 A | 2/1999 | Kanno .......................... 702/130 |

(Continued)

FOREIGN PATENT DOCUMENTS

| JP | 11-111823 | 4/1999 |
| JP | 11-204402 | 7/1999 |

(Continued)

*Primary Examiner* — Kavita Padmanabhan
*Assistant Examiner* — Jason Lin
(74) *Attorney, Agent, or Firm* — Oblon, Spivak, McClelland, Maier & Neustadt, L.L.P.

(57) ABSTRACT

An object of the present invention is to perform temperature setting of a heating plate so that a wafer is uniformly heated in an actual heat processing time. The temperature of a wafer is measured during a heat processing period from immediately after a temperature measuring wafer is mounted on the heating plate to the time when the actual heat processing time elapses. Whether the uniformity in temperature within the wafer is allowable or not is determined from the temperature of the wafer in the heat processing period, and if the determination result is negative, a correction value for a temperature setting parameter of the heating plate is calculated using a correction value calculation model from the measurement result, and the temperature setting parameter is changed.

14 Claims, 13 Drawing Sheets

(51) Int. Cl.
*H01L 21/20* (2006.01)
*H01L 21/44* (2006.01)
*H01L 21/265* (2006.01)
*H01L 21/425* (2006.01)
*H01L 21/00* (2006.01)
*H01L 21/469* (2006.01)
*H05B 3/68* (2006.01)
*F27D 11/00* (2006.01)
*F27D 5/00* (2006.01)
*F27D 13/00* (2006.01)
*H01L 21/67* (2006.01)
*C10B 21/20* (2006.01)
*F27D 15/02* (2006.01)

(56) References Cited

U.S. PATENT DOCUMENTS

| | | | |
|---|---|---|---|
| 5,927,077 A | 7/1999 | Hisai et al. | 62/3.3 |
| 6,051,349 A | 4/2000 | Yoshioka et al. | 430/30 |
| 6,191,394 B1 | 2/2001 | Shirakawa et al. | 219/444.1 |
| 6,402,509 B1 | 6/2002 | Ookura et al. | 432/253 |
| 6,561,694 B1 | 5/2003 | Lerch et al. | 374/126 |
| 6,566,632 B1 * | 5/2003 | Katata et al. | 219/444.1 |
| 6,673,155 B2 * | 1/2004 | Nagashima et al. | 118/666 |
| 6,815,647 B2 | 11/2004 | Tanoue et al. | 219/444.1 |
| 7,017,658 B2 * | 3/2006 | Hisai et al. | 165/201 |
| 2001/0055102 A1 | 12/2001 | Emoto | 355/53 |
| 2002/0037462 A1 | 3/2002 | Ogata et al. | 430/30 |
| 2003/0140850 A1 | 7/2003 | Keeton et al. | 118/500 |
| 2003/0164946 A1 | 9/2003 | Borden et al. | 356/432 |
| 2003/0183613 A1 | 10/2003 | Takano | 219/390 |
| 2004/0149715 A1 | 8/2004 | Timans et al. | 219/390 |
| 2004/0186622 A1 | 9/2004 | Aiuchi et al. | 700/241 |
| 2004/0226936 A1 | 11/2004 | Oyama et al. | 219/444.1 |
| 2005/0148104 A1 | 7/2005 | Kota et al. | 438/14 |
| 2006/0126701 A1 * | 6/2006 | Nozawa et al. | 374/141 |

FOREIGN PATENT DOCUMENTS

| | | |
|---|---|---|
| JP | 11-219888 | 8/1999 |
| JP | 11-274030 | 10/1999 |
| JP | 2000-180071 | 6/2000 |
| JP | 2000-321755 | 11/2000 |
| JP | 2001-143850 | 5/2001 |
| JP | 2002-124457 | 4/2002 |
| JP | 2003-51439 | 2/2003 |
| JP | 2004-134723 | 4/2004 |
| JP | 2005-150696 | 6/2005 |

\* cited by examiner $$\text{ACCUMULATED REACTION TEMPERATURE} = \int_0^H \{L(s, \tau) \times T(s)\} ds \quad \cdots (1)$$

| WAFER TEMPERATURE | TEMPERATURE SETTING PARAMETER | | | |
|---|---|---|---|---|
| | a | b | c | d |
| ⋮ | ⋮ | ⋮ | ⋮ | ⋮ |
| −0.5 | +8 | +5 | +10 | +7 |
| −0.4 | +6 | +4 | +8 | +6 |
| −0.3 | +4 | +3 | +6 | +4 |
| −0.2 | +3 | +2 | +4 | +3 |
| −0.1 | +1 | +1 | +2 | +2 |
| +0.1 | −1 | −1 | −2 | −2 |
| +0.2 | −3 | −2 | −4 | −3 |
| +0.3 | −4 | −3 | −6 | −4 |
| +0.4 | −6 | −4 | −8 | −6 |
| +0.5 | −8 | −5 | −10 | −7 |
| ⋮ | ⋮ | ⋮ | ⋮ | ⋮ |

TEMPERATURE SETTING METHOD OF HEAT PROCESSING PLATE, TEMPERATURE SETTING APPARATUS OF HEAT PROCESSING PLATE, PROGRAM, AND COMPUTER-READABLE RECORDING MEDIUM RECORDING PROGRAM THEREON

CROSS-REFERENCE TO RELATED APPLICATIONS

This application is a divisional of application Ser. No. 11/721,612, filed Jun. 13, 2007, the contents of which is incorporated herein in its entirety by reference. U.S. application Ser. No. 11/721,612 is the National Stage of International Application No. PCT/JP2005/022454, filed Dec. 7, 2005, which claims the priority to Japanese Application No. 2004-360064, filed Dec. 13, 2004.

DESCRIPTION

1. Technical Field

The present invention relates to a temperature setting method of a heat processing plate, a temperature setting apparatus of a heat processing plate, a program, and a computer-readable recording medium recording the program thereon.

2. Background Art

In a photolithography process in manufacturing, for example, a semiconductor device, for example, a plurality of kinds of heat processing such as heat processing of evaporating a solvent in a resist film applied on a wafer (pre-baking), heat processing of accelerating the chemical reaction in the resist film after exposure of a pattern (post-exposure baking), and heat processing after developing treatment (post-baking) and so on are performed.

The above heat processing is usually performed in a heat processing unit by mounting and heating the wafer on a heating plate. To manufacture semiconductor devices uniform within the wafer, it is necessary to heat the wafer at a temperature uniform within the wafer. To this end, a heating plate is used which is divided into a plurality of regions and temperature-settable for each of the regions.

Incidentally, the temperature setting of the heating plate performed before the heat processing is performed using a temperature measuring wafer which is mounted on the heating plate to measure the temperature (see Patent Document 1). Usually, the temperature measuring wafer is mounted on the heating plate and kept standing until the measurement temperature by the temperature measuring wafer becomes uniform within the wafer, and at a point in time when the temperature becomes uniform, the temperatures of the regions of the hating plate are set. Usually, it takes about 10 minutes to about 20 minutes until the temperature within the wafer becomes uniform after the temperature measuring wafer is mounted on the heating plate.

However, when the temperature setting of the heating plate was performed at the point in time when the in-plane temperature of the temperature measuring wafer became uniform after the temperature measuring wafer was mounted on the heating plate and kept standing for about 10 minutes to about 20 minutes as described above, actually it was verified that the temperature within a wafer to be processed did not become precisely uniform in an actual wafer processing period which is finished in about 60 seconds to about 90 seconds after the wafer is mounted on the heating plate. This can cause, for example, variations in patterns formed on the wafer by a photolithography process.

PATENT DOCUMENT 1

Japanese Patent Application Laid-open No. 2002-124457

DISCLOSURE OF THE INVENTION

Problems to Be Solved by the Invention

The present invention has been developed in consideration of the above viewpoint and its object is to provide a temperature setting method of setting a temperature of a heat processing plate such as a heating plate so that a substrate such as a wafer is heated uniform within the substrate in an actual heat processing time, a temperature setting apparatus of a heat processing plate, a program, and a computer-readable recording medium recording the program thereon.

Means for Solving the Problems

The present invention attaining the above object is a temperature setting method of a heat processing plate for mounting and heat-processing a substrate thereon, the heat processing plate being divided into a plurality of regions and temperature-settable for each of the regions, the method including: a first step of mounting on the heat processing plate a temperature measuring substrate having a same shape as a shape of the substrate and simulatively measuring a temperature of the substrate to be mounted on the heat processing plate in a heat processing time; and a second step of setting temperatures of the regions of the heat processing plate based on a result of the temperature measurement so that the temperature within the substrate is kept uniform during a heat processing period from the when the substrate is mounted on the heat processing plate to the time when a predetermined heat processing time elapses in an actual heat processing time.

According to the present invention, the temperature within the substrate becomes uniform in the actual heat processing period, and therefore the substrate is uniformly heated by the heat processing. As a result of this, for example, the line width of the circuit pattern is uniformly formed on the substrate.

The present invention according to another aspect is a temperature setting method of a heat processing plate for mounting and heat-processing a substrate thereon, the heat processing plate being divided into a plurality of regions and temperature-settable for each of the regions, the method including: a first step of measuring a temperature at a periphery of the substrate mounted on the heat processing plate and estimating a temperature of the substrate to be mounted on the heat processing plate in a heat processing time; and a second step of setting temperatures of the regions of the heat processing plate based on a result of the temperature estimation so that the temperature within the substrate is kept uniform during a heat processing period from the when the substrate is mounted on the heat processing plate to the time when a predetermined heat processing time elapses in an actual heat processing time.

According to the present invention, the temperature within the substrate becomes uniform in the actual heat processing period, and therefore the substrate is uniformly heated by the heat processing. As a result of this, for example, the line width of the circuit pattern is uniformly formed on the substrate.

The temperature at the periphery of the substrate may be a temperature of each of the regions of the heat processing plate, or may be a temperature of an atmosphere at the periphery of the substrate on the heat processing plate. Alternatively, the temperature at the periphery of the substrate may be a temperature of a member at the periphery of the substrate on the heat processing plate.

In the temperature setting method of a heat processing plate described above, the temperatures of the regions of the heat processing plate may be set so that any one or more of a temperature during an initial temperature fluctuation period, a temperature during a temperature steady period after the temperature fluctuation period, and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate. Note that the reaction factor is a factor indicating the degree of the reaction of the film at each temperature.

The present invention according to another aspect is a temperature setting method of a heat processing plate for mounting and heat-processing a substrate thereon, the heat processing plate being divided into a plurality of regions and temperature-settable for each of the regions, the method including: a first step of converting a processing result of the substrate into a temperature of the substrate to be mounted on the heat processing plate in a heat processing time; and a second step of setting temperatures of the regions of the heat processing plate based on a result of the temperature conversion so that the temperature within the substrate is kept uniform during a heat processing period from the when the substrate is mounted on the heat processing plate to the time when a predetermined heat processing time elapses in an actual heat processing time.

According to the present invention, the temperature within the substrate becomes uniform in the actual heat processing period, and therefore the substrate is uniformly heated by the heat processing.

The processing result of the substrate may be a line width of a pattern formed on the substrate by a photolithography technology including the heat processing.

In the temperature setting method of a heat processing plate, the temperatures of the regions of the heat processing plate may be set so that any one or more of a temperature during a temperature steady period and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate.

The temperature setting method of a heat processing plate described above may further include the steps of: acquiring temperature data on the temperature of the substrate obtained by the first step; determining whether the uniformity in temperature within the substrate is allowable or not based on the acquired temperature data; when the determination is negative, calculating a correction value for a temperature setting parameter of the heat processing plate using the temperature data and correction value calculation data set in advance; and changing the temperature setting parameter based on the correction value.

Further, the correction value calculation data may be modified when the uniformity in temperature within the substrate is not improved even though the temperature setting of each of the regions of the heat processing plate is adjusted based on the correction value.

The present invention according to another aspect is a temperature setting apparatus of a heat processing plate for mounting and heat-processing a substrate thereon, the heat processing plate being divided into a plurality of regions and temperature-settable for each of the regions, the apparatus including: a temperature measuring substrate having a same shape as a shape of the substrate, for being mounted on the heat processing plate and simulatively measuring a temperature of the substrate to be mounted on the heat processing plate in a heat processing time; and a control unit for setting temperatures of the regions of the heat processing plate based on a result of the temperature measurement by the temperature measuring substrate so that the temperature within the substrate is kept uniform during a heat processing period from the when the substrate is mounted on the heat processing plate to the time when a predetermined heat processing time elapses in an actual heat processing time.

According to the present invention, the temperature within the substrate becomes uniform in the actual heat processing period, and therefore the substrate is uniformly heated by the heat processing. As a result of this, for example, the line width of the circuit pattern is uniformly formed on the substrate.

The present invention according to another aspect is a temperature setting apparatus of a heat processing plate for mounting and heat-processing a substrate thereon, the heat processing plate being divided into a plurality of regions and temperature-settable for each of the regions, the apparatus including: a temperature sensor for measuring a temperature at a periphery of the substrate mounted on the heat processing plate; and a control unit for estimating a temperature of the substrate to be mounted on the heat processing plate in a heat processing time from a result of the temperature measurement by the temperature sensor, and setting temperatures of the regions of the heat processing plate based on a result of the temperature estimation so that the temperature within the substrate is kept uniform during a heat processing period from the when the substrate is mounted on the heat processing plate to the time when a predetermined heat processing time elapses in an actual heat processing time.

The temperature sensor may be one measuring the temperature of each of the regions of the heat processing plate, or may be one measuring a temperature of an atmosphere at the periphery of the substrate on the heat processing plate. Alternatively, the temperature sensor may be one measuring a temperature of a member at the periphery of the substrate on the heat processing plate.

The control unit may set the temperatures of the regions of the heat processing plate so that any one or more of a temperature during an initial temperature fluctuation period, a temperature during a temperature steady period after the temperature fluctuation period, and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate.

The present invention according to another aspect is a temperature setting apparatus of a heat processing plate for mounting and heat-processing a substrate thereon, the heat processing plate being divided into a plurality of regions and temperature-settable for each of the regions, the apparatus including: a control unit for converting a processing result of the substrate into a temperature of the substrate to be mounted on the heat processing plate in a heat processing time, and setting temperatures of the regions of the heat processing plate based on a result of the temperature conversion so that the temperature within the substrate is kept uniform during a heat processing period from the when the substrate is mounted on the heat processing plate to the time when a predetermined heat processing time elapses in an actual heat processing time.

According to the present invention, the temperature within the substrate becomes uniform in the actual heat processing period, and therefore the substrate is uniformly heated by the heat processing.

The processing result of the substrate may be a line width of a pattern formed on the substrate by a photolithography technology including the heat processing.

The control unit may set the temperatures of the regions of the heat processing plate so that any one or more of a temperature during a temperature steady period and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate.

The control unit may have functions of: acquiring temperature data on the temperature of the substrate in the heat processing period; determining whether the uniformity in temperature within the substrate is allowable or not based on the acquired temperature data; when the determination is negative, calculating a correction value for a temperature setting parameter of the heat processing plate using the temperature data and correction value calculation data set in advance; and changing the temperature setting parameter based on the correction value.

The control unit may further have a function of modifying the correction value calculation data when the uniformity in temperature within the substrate is not improved even though the temperature setting of each of the regions of the heat processing plate is adjusted based on the correction value.

According to the present invention according to another aspect, the present invention is a program for causing a computer to realize a function of a control unit in a temperature setting apparatus of a heat processing plate, the heat processing apparatus being a temperature setting apparatus of a heat processing plate for mounting and heat-processing a substrate thereon, the heat processing plate being divided into a plurality of regions and temperature-settable for each of the regions. The heat processing apparatus further has a temperature sensor for measuring a temperature at a periphery of the substrate mounted on the heat processing plate; and a control unit for estimating a temperature of the substrate to be mounted on the heat processing plate in a heat processing time from a result of the temperature measurement by the temperature sensor, and setting temperatures of the regions of the heat processing plate based on a result of the temperature estimation so that the temperature within the substrate is kept uniform during a heat processing period from the when the substrate is mounted on the heat processing plate to the time when a predetermined heat processing time elapses in an actual heat processing time.

According to the present invention according to another aspect, the present invention is a computer-readable recording medium storing a program for causing a computer to realize a function of a control unit in a temperature setting apparatus of a heat processing plate, the heat processing apparatus being a temperature setting apparatus of a heat processing plate for mounting and heat-processing a substrate thereon, the heat processing plate being divided into a plurality of regions and temperature-settable for each of the regions. The heat processing apparatus further has a temperature sensor for measuring a temperature at a periphery of the substrate mounted on the heat processing plate; and a control unit for estimating a temperature of the substrate to be mounted on the heat processing plate in a heat processing time from a result of the temperature measurement by the temperature sensor, and setting temperatures of the regions of the heat processing plate based on a result of the temperature estimation so that the temperature within the substrate is kept uniform during a heat processing period from the when the substrate is mounted on the heat processing plate to the time when a predetermined heat processing time elapses in an actual heat processing time.

Effect of the Invention

According to the present invention, the substrate can be precisely uniformly heat-processed in an actual heat processing time, so that the processing within the substrate is uniformly performed, resulting in improved yields.

EXPLANATION OF CODES

Figure 1:
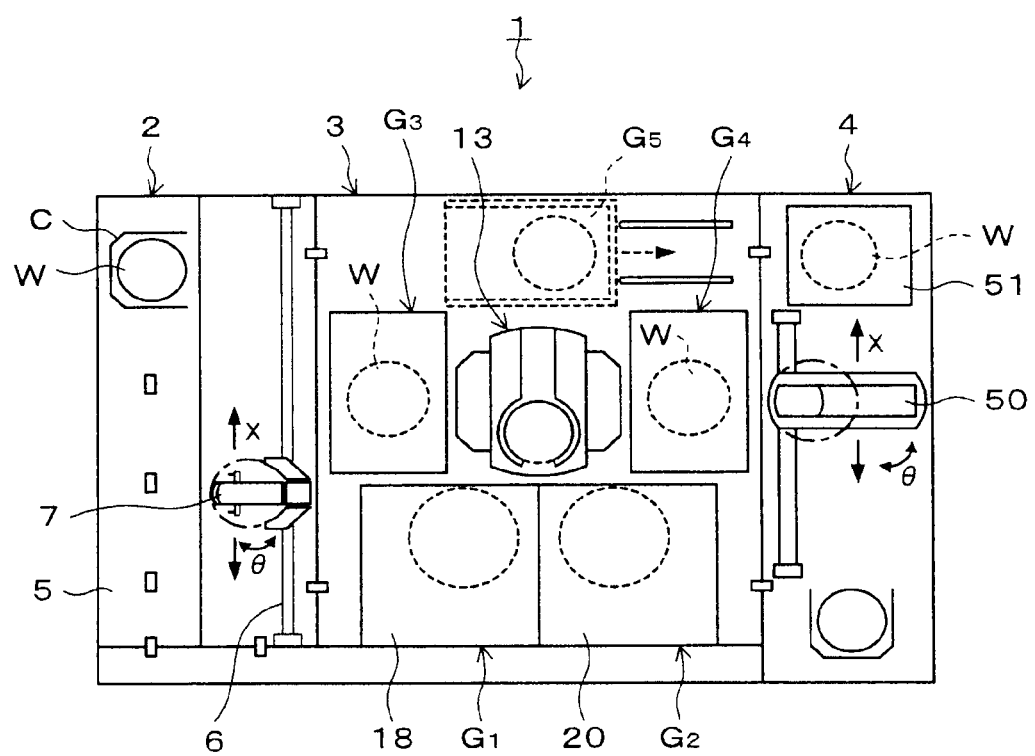
FIG. 1 A plan view showing the outline of a configuration of a coating and developing treatment system in the present embodiment.

1 coating and developing treatment system
44 PEB unit
63 heating plate 63a to 63e region
67 heater controller
101 control unit
110 temperature measuring wafer
W wafer

BEST MODE FOR CARRYING OUT THE INVENTION

Figure 2:
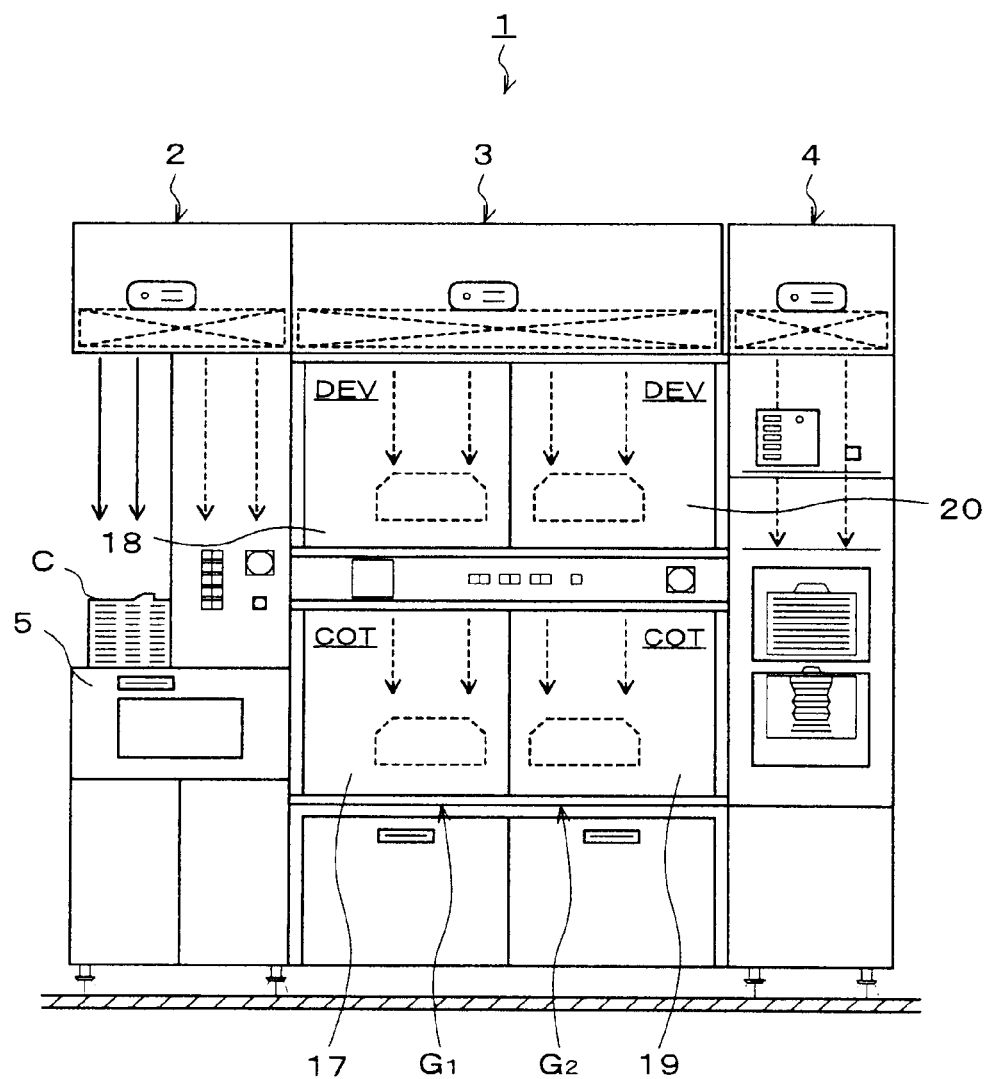
FIG. 2 A front view of the coating and developing treatment system in FIG. 1
Figure 3:
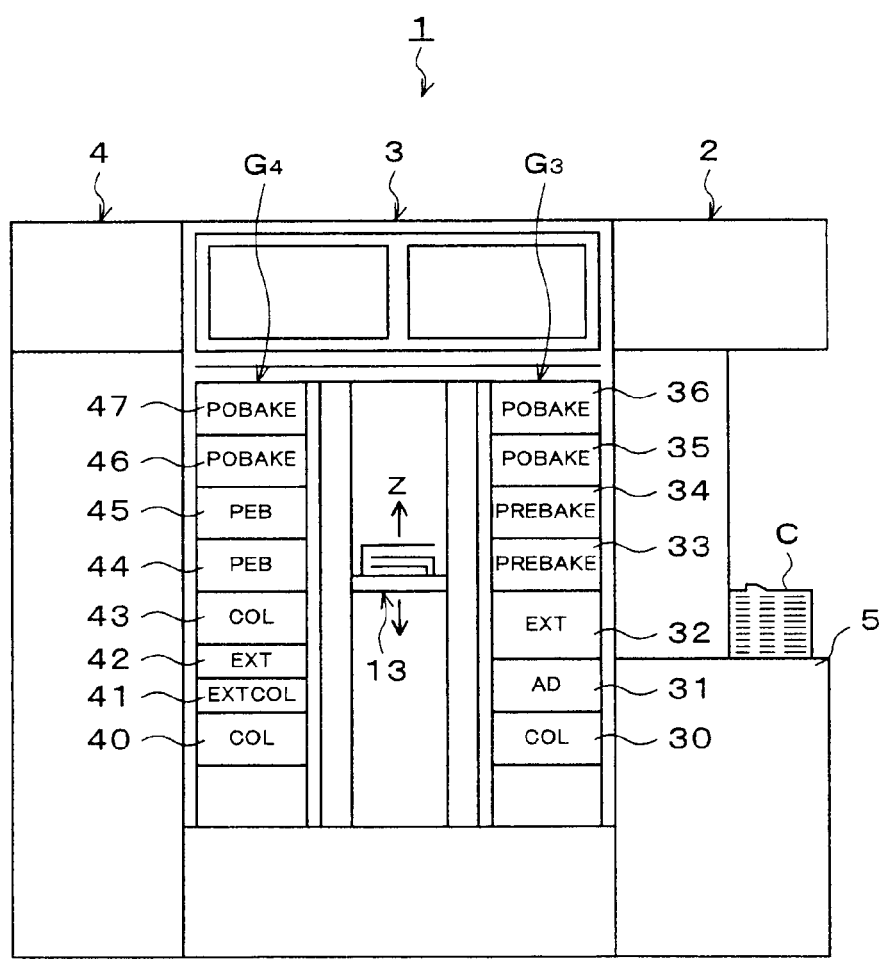
FIG. 3 A rear view of the coating and developing treatment system in FIG. 1.

Hereinafter, a preferred embodiment of the present invention will be described. FIG. 1 is a plan view showing the outline of a configuration of a coating and developing treatment system 1 in this embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for delivering the wafers W to/from a not-shown aligner provided adjacent to the processing station 3, are integrally connected together.

In the cassette station 2, a plurality of cassettes C can be mounted at predetermined positions on a cassette mounting table 5 in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette C (a Z-direction; the vertical direction), and thus can selectively access the wafers W in each of the cassettes C arranged in the X-direction.

The wafer transfer body 7 has an alignment function of aligning the wafer W. The wafer transfer body 7 can access an extension unit 32 included in a third processing unit group G3 on the processing station 3 side and transfer the wafer W to the extension unit 32 as described later.

In the processing station 3, a main transfer unit 13 is provided at its central portion, and various kinds of processing and treatment units are multi-tiered to constitute processing unit groups around the main transfer unit 13. In the coating and developing treatment system 1, four processing unit groups G1, G2, G3 and G4 are arranged. The first and second processing unit groups G1 and G2 are placed on the front side in the coating and developing treatment system 1, the third processing unit group G3 is placed adjacent to the cassette station 2, and the fourth processing unit group G4 is placed adjacent to the interface section 4. Further, a fifth processing unit group G5 shown by a broken line can be separately placed on the rear side as an option. The main transfer unit 13 can transfer the wafer W to later-described various kinds of processing and treatment units arranged in these processing unit groups G1 to G5.

In the first processing unit group G1, for example, as shown in FIG. 2, a resist coating unit 17 for applying a resist solution onto the wafer W, and a developing treatment unit 18 for performing developing treatment for the wafer W after exposure are two-tiered in order from the bottom. Similarly, in the second processing unit group G2, a resist coating unit 19 and a developing treatment unit 20 are two-tiered in order from the bottom.

In the third processing unit group G3, for example, as shown in FIG. 3, a cooling unit 30 for performing cooling processing for the wafer W, an adhesion unit 31 for enhancing the adhesion between the resist solution and the wafer W, the extension unit 32 for keeping the wafer W waiting therein, pre-baking units 33 and 34 each for drying the solvent in the resist solution, and post-baking units 35 and 36 each for performing heat-processing after the developing treatment and the like, are seven-tiered in order from the bottom.

In the fourth processing unit group G4, for example, a cooling unit 40, an extension and cooling unit 41 for allowing the wafer W mounted thereon to dry naturally, an extension unit 42, a cooling unit 43, post-exposure baking units (hereinafter, referred to as "PEB units") 44 and 45 each for heating the wafer W after exposure, and post-baking units 46 and 47 and the like are, for example, eight-tiered in order from the bottom.

As shown in FIG. 1, at the central portion of the interface section 4, a wafer transfer body 50 is provided. The wafer transfer body 50 is configured to be movable in the X-direction and the Z-direction and also rotatable in a O-direction (a rotation direction around the Z-axis), and thus can access the extension and cooling unit 41 and the extension unit 42 included in the fourth processing unit group G4, an edge exposure unit 51, and the not-shown aligner and transfer the wafer W to them.

Figure 4:
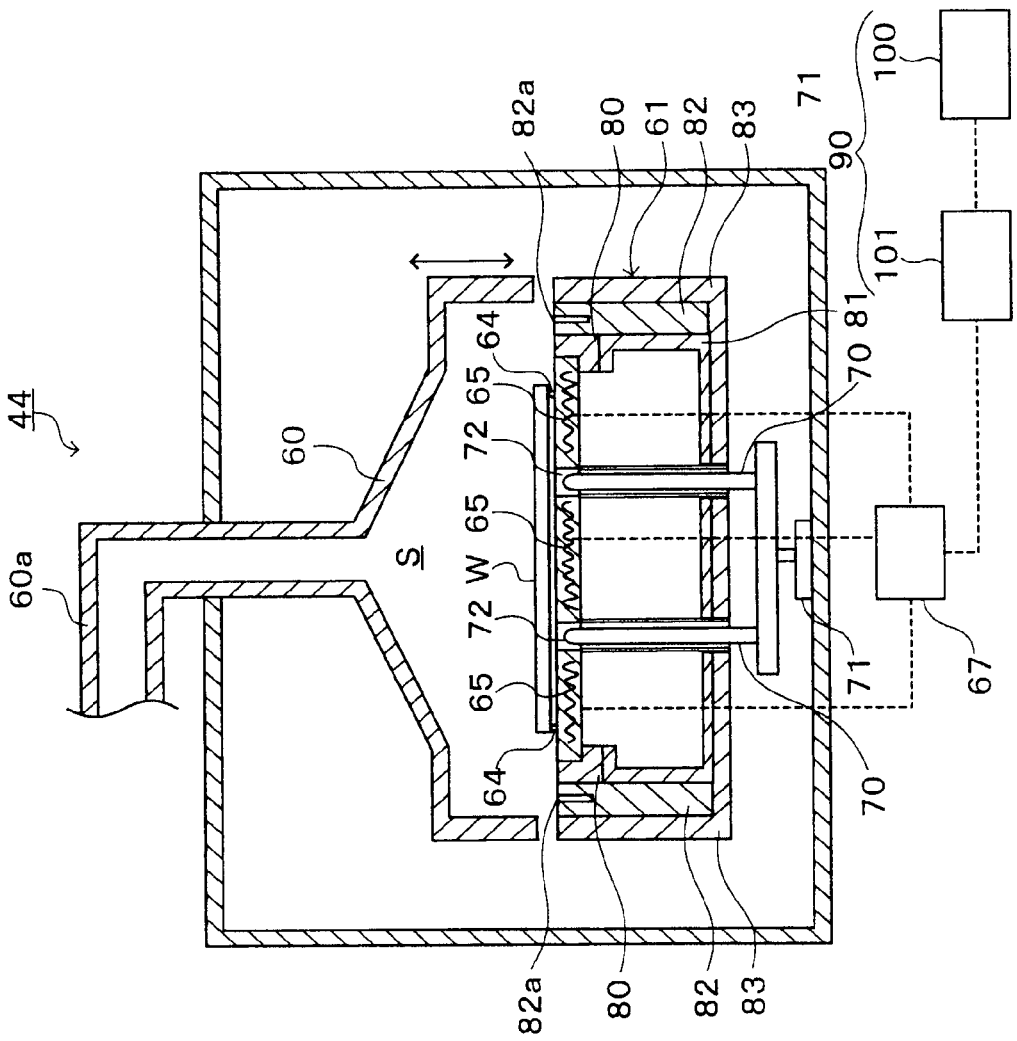
FIG. 4 An explanatory view of a longitudinal section showing the outline of a configuration of a PEB unit.

Next, the configuration of the above-described PEB unit 44 will be described. As shown in FIG. 4, the PEB unit 44 has a lid body 60 that is located on the upper side and vertically movable, and a heating plate accommodating unit 61 that is located on the lower side and forms a processing chamber S together with the lid body 60.

The lid body 60 has an almost conical shape increasing in height toward its central portion, and is provided with an exhaust portion 60a at its tip portion. The atmosphere in the processing chamber S is uniformly exhausted through the exhaust portion 60a.

At the center of the heating plate accommodating unit 61, a heating plate 63 is provided as a heat processing plate for mounting and heating the wafer W thereon. The heating plate 63 has a substantially disk shape with a large thickness. On the front surface of the heating plate 63, support pins 64 are provided at a plurality of locations for supporting the wafer W when the wafer W is mounted.

Figure 5:
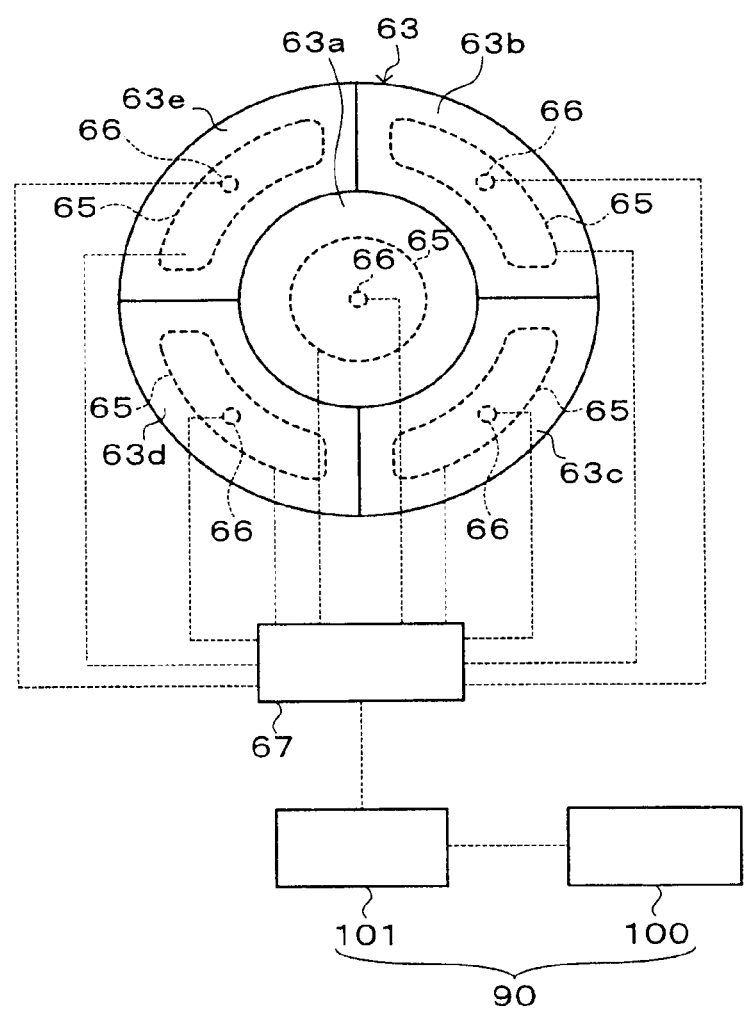
FIG. 5 A plan view showing a configuration of a heating plate of the PEB unit.

The heating plate 63 is divided into a plurality of, for example, five regions 63a, 63b, 63c, 63d, and 63e as shown in FIG. 5. The heating plate 63 is divided, for example, into the circular region 63a which is located at the central portion and the regions 63b to 63e which are made by equally dividing the peripheral portion around the region 63a into four sectors, as seen in plan view.

A heater 65 generating heat by power feeding is individually embedded in each of the regions 63a to 63e of the heating plate 63 and can individually heat each of the regions 63a to 63e. In the regions 63a to 63e, temperature sensors 66 are provided, respectively. The measurement results of the temperature sensors 66 can be outputted to a heater controller 67. The heater controller 67 can adjust the amount of power fed to the heater 65 based on the measurement result of the temperature sensor 66 so that the temperature of each of the regions 63a to 63e is brought to a predetermined set temperature. Note that a plurality of sensors may be provided in each of the regions 63a to 63e.

As shown in FIG. 4, raising and lowering pins 70 for supporting and raising and lowering the wafer W when the wafer W is transferred in/out are provided below the heating plate 63. The raising and lowering pins 70 are configured to be vertically movable by a raising and lowering drive mechanism 71. Near the central portion of the heating plate 63, through holes 72 vertically passing through the heating plate 63 are formed so that the raising and lowering pins 70 pass through the through holes 72 to project to above the heating plate 63.

The heating plate accommodating unit 61 has an annular support member 80 for accommodating and supporting the outer peripheral portion of the heating plate 63, and a support table 81 for supporting the support member 80 at its bottom. For the support member 80, a heat insulator is used to prevent heat of the heating plate 63 from escaping to the outside. Further, the support table 81 is formed in an almost cylindrical shape with its upper face open.

The heating plate accommodating unit 61 has a support ring 82 in an almost cylindrical shape surrounding the support member 80 and the support table 81. The upper surface of the support ring 82 is formed with a blow port 82a for jetting, for example, an inert gas toward the inside of the processing chamber S, so that the jetting of the inert gas from the blow port 82a can purge the processing chamber S. Further, a case 83 in a cylindrical shape is provided which is an outer periphery of the heating plate accommodating unit 61.

In the heat processing in the PEB unit 44 configured as described above, the wafer W is first transferred to a position above the heating plate 63 with the lid body 60 raised to open the processing chamber S, and passed to the raising and lowering pins 70 which have been raised and waiting in advance. Subsequently, the lid body 60 is lowered and united with the heating plate accommodating unit 61 to close the processing chamber S, and the raising and lowering pins 70 are then lowered so that the wafer W is mounted onto the heating plate 63 which has been controlled to a predetermined temperature. At this moment, heating of the wafer W is started. After a lapse of a predetermined heat-processing time, for example, about 60 seconds to about 90 seconds, the wafer W is raised from the top of the heating plate 63 by the raising and lowering pins 70, with which the heating of the wafer W ends. Thereafter, the lid body 60 is raised to open the processing chamber S, and the wafer W is then transferred out of the PEB unit 44, with which the heat processing ends.

Next, a temperature setting apparatus 90 for performing temperature setting of the heating plate 63 in the PEB unit 44 configured as described above will be described.

Figures 6, 7:
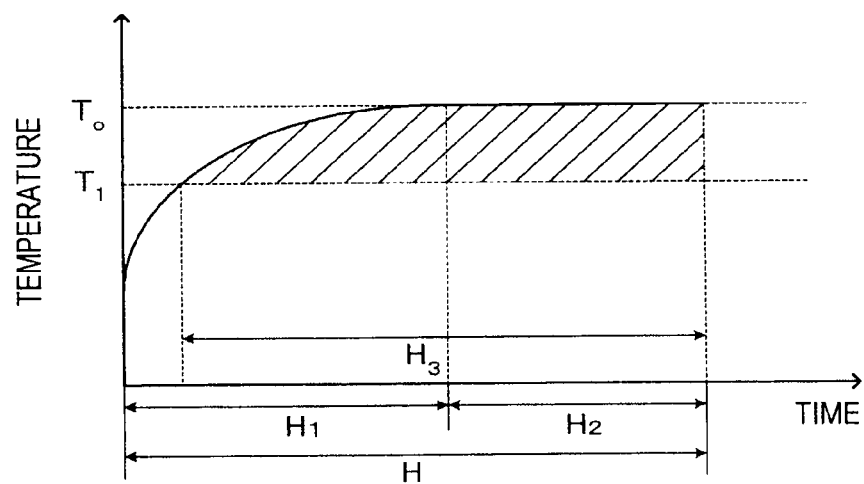
FIG. 6 A graph showing temperature fluctuations of a wafer during heat processing.
FIG. 7 An expression for calculating the accumulated reaction temperature.

As shown in FIG. 6, in an actual heat processing time, a heat processing period H from the time when the wafer W is mounted on the heating plate 63 to the time when a predetermined heat processing time elapses, has a temperature fluctuation period $H_1$ during which the wafer temperature increases toward a target temperature $T_0$ immediately after the wafer W is mounted on the heating plate 63, and a temperature steady period $H_2$ during which the wafer temperature is stabilized at the target temperature $T_0$ after the temperature fluctuation period $H_1$. In the heat processing period H, there also is a reaction period $H_3$ during which the wafer temperature exceeds, for example, a reaction temperature $T_1$ of a surface film of the wafer W to cause a chemical reaction in the surface film of the wafer W. The temperature setting apparatus 90 in the present embodiment can individually set the temperature of each of the regions 63a to 63e of the heating plate 63. The temperature setting apparatus 90 can select and set any one or more of the temperature during the temperature fluctuation period $H_1$, the temperature during the temperature steady period $H_2$, the accumulated temperature during the reaction period $H_3$, and an accumulated reaction temperature obtained by multiplying the temperatures in the heat processing period H by reaction factors of the resist film on the wafer surface and accumulating resulting temperatures, in each of the regions 63a to 63e. Note that the accumulated temperature during the reaction period $H_3$ can be indicated, for example, by the area of a hatching portion shown in FIG. 6, which represents the amount of energy to be supplied to the wafer W during the reaction of the wafer surface. The accumulated reaction temperature in the heat processing period H can be expressed by Expression (1) shown in FIG. 7. In Expression (1), T represents temperature, s represents time, and L represents the reaction factor.

The temperature setting apparatus 90 comprises, for example, a temperature measuring unit 100 and a control unit 101 as shown in FIG. 4. The control unit 101 can communicate with the temperature measuring unit 100 and the heater controller 67.

Figure 8:
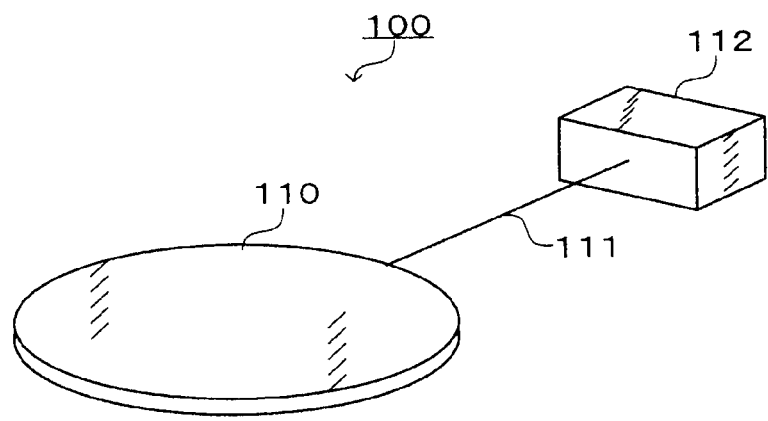
FIG. 8 A perspective view showing a configuration of a temperature measuring unit.
Figure 9:
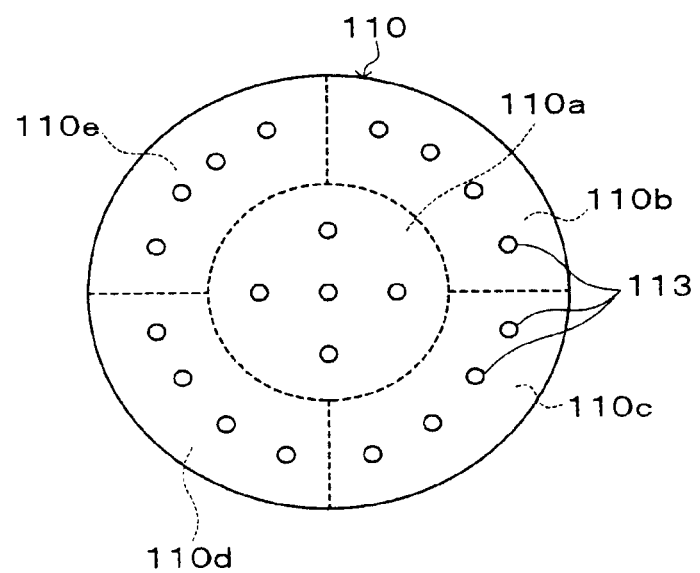
FIG. 9 A plan view of a temperature measuring wafer.

The temperature measuring unit 100 is composed of a temperature measuring wafer 110 to be mounted on the heating plate 63 so that the wafer temperature is measured, a cable 111, and a temperature measuring device 112 as shown in FIG. 8. The temperature measuring wafer 110 is made in the same shape and of the same material as those of the wafer to be processed. In the temperature measuring wafer 110, a plurality of temperature sensors 113 are arranged evenly, for example, as shown in FIG. 9. This allows for measurement of the temperatures of the wafer regions 110a to 110e corresponding to the regions 63a to 63e of the heating plate 63. The temperature measuring wafer 110 and the measuring device 112 are connected to each other via the cable 111, so that the temperatures detected by the temperature measuring wafer 110 can be outputted over the cable 111 to the measuring device 112 in which the temperatures of the wafer regions 110a to 110e can be measured. The temperatures measured in the measuring device 112 can be outputted to the control unit 101 with or without wires. Note that the temperature measuring unit 100 may be one in which the temperatures detected by the temperature measuring wafer 110 are outputted to the measuring device 112 without wires.

The control unit 101 has a function of a general-purpose computer including, for example, a CPU and a memory. The function of the control unit 101 which will be described in the following is executed, for example, by a program installed from a computer-readable recording medium. The control unit 101 comprises, for example, as shown in FIG. 10, a computing part 120, an input part 121 for a user to select and input any one or more of the temperature during the temperature fluctuation period $H_1$, the temperature during the temperature steady period $H_2$, the accumulated temperature during the reaction period $H_3$, and the accumulated reaction temperature in the heat processing period H, which will be set contents; a data storage part 122 for storing temperature data inputted from the measuring unit 112; a model storage part 123 for storing a correction value calculation model M as correction value calculation data to calculate a correction value for a temperature setting parameter for temperature adjustment of the heating plate 63; and a program storage part 124 for storing various kinds of programs.

The program storage part 124 stores a temperature data acquisition program P1 to acquire predetermined temperature data from the measuring unit 112 and store the data into the data storage part 122; a determination program P2 to determine whether the uniformity in temperature within the wafer is allowable or not based on the temperature data stored in the data storage part 122; a correction value calculation program P3 to calculate the correction value for the temperature setting parameter using the correction value calculation model M when the determination by the determination program P2 is a negative determination; a temperature setting parameter change program P4 to change the temperature setting parameter in the heater controller 67 based on the correction value; and a correction value calculation model modification program P5 to modify the correction value calculation model M when the uniformity in the in-plane temperature of the wafer is not improved even though the temperature setting parameter is changed.

Figures 10, 11:
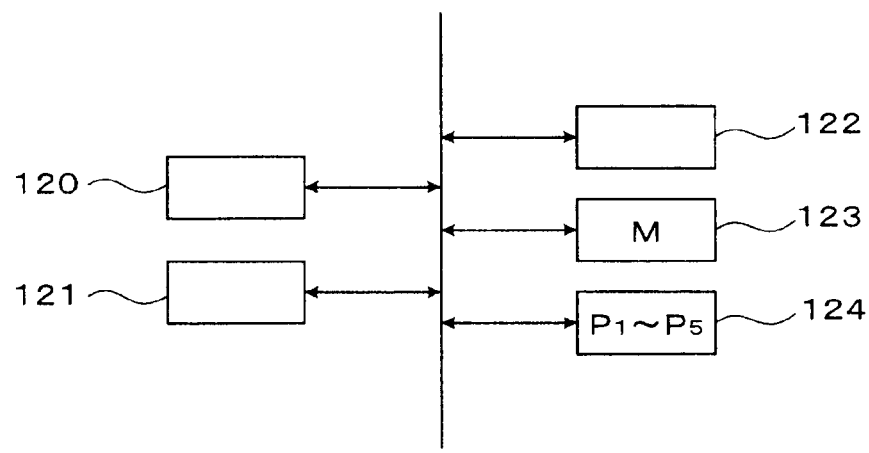
FIG. 10 A block diagram showing a configuration of a control unit.
FIG. 11 An explanatory view of a correction value calculation model.

The correction value calculation model M is composed of, as shown in FIG. 11, a matrix showing correlations between the amounts of fluctuation in a temperature setting parameter a for adjusting the temperature during the temperature fluctuation period $H_1$; in a temperature setting parameter b for adjusting the temperature during the temperature steady period $H_2$; in a temperature setting parameter c for adjusting the accumulated temperature during the reaction period $H_3$; and in a temperature setting parameter d for adjusting the accumulated reaction temperature in the heat processing period H, and the amount of fluctuation in wafer temperature. For example, the temperature setting parameter a for the temperature during the temperature fluctuation period $H_1$ affects the temperature fluctuation rate of the wafer W by changing the amount of power fed to the heating plate 63, and the temperature setting parameter b for the temperature during the temperature steady period $H_2$, the temperature setting parameter c for the accumulated temperature during the reaction period $H_3$, and the temperature setting parameter d for the accumulated reaction temperature in the heat processing period H affect, for example, the target temperature $T_0$. Note that the correlations between the amounts of fluctuation in the temperature setting parameters a to d and the amount of fluctuation in the wafer temperature may be correlations obtained for each of the regions of the heating plate 63.

Figure 12:
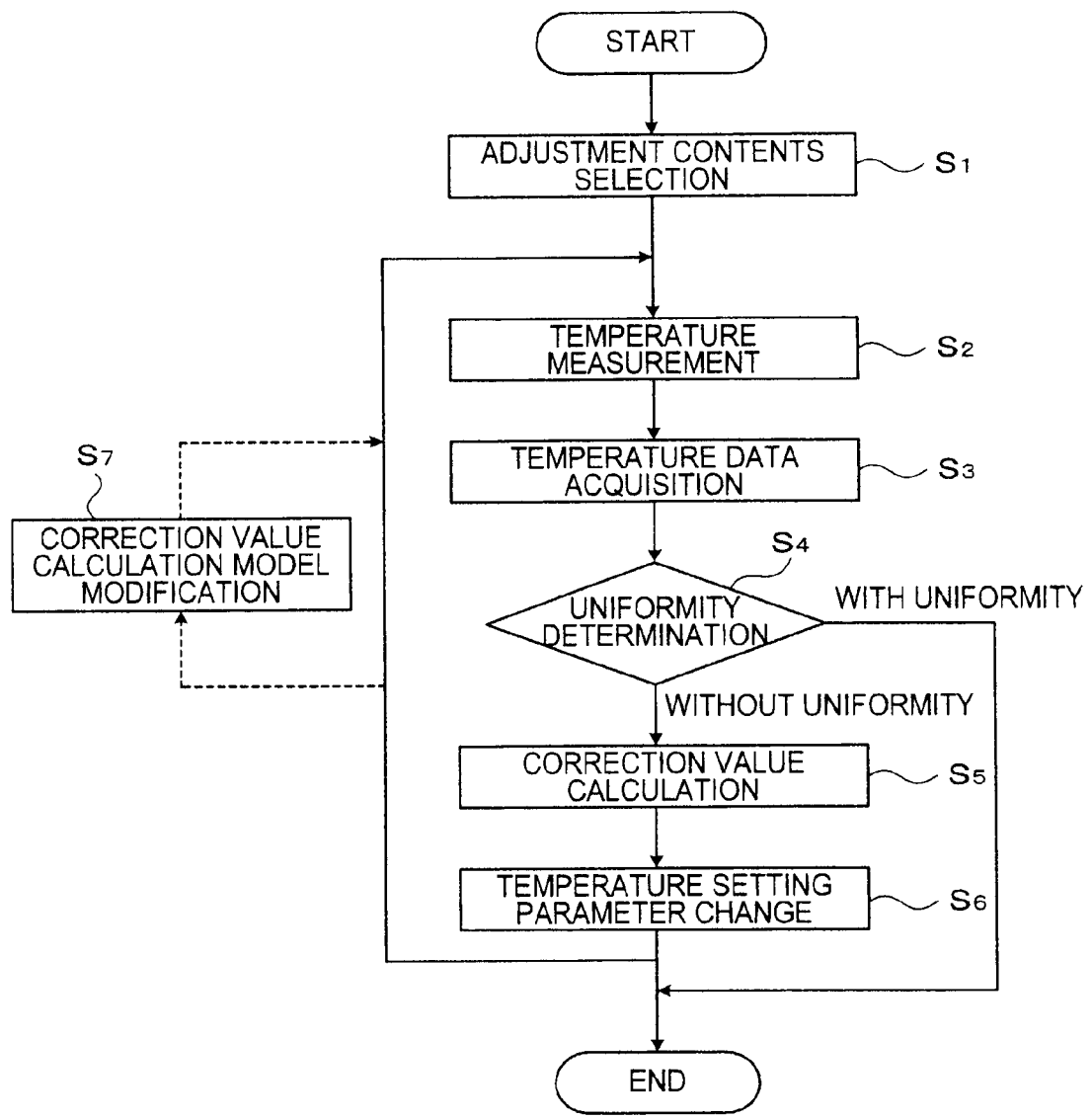
FIG. 12 A flowchart of a temperature setting process.

Next, a temperature setting process for the heating plate 63 in the PEB unit 44 using the temperature setting apparatus 90 configured as described above will be described. FIG. 12 is a flowchart showing the temperature setting process.

First of all, the user selects an adjustment object to be adjusted uniform within the wafer, for example, from among the temperature during the temperature fluctuation period $H_1$, the temperature during the temperature steady period $H_2$, the accumulated temperature during the reaction period $H_3$, and the accumulated reaction temperature in the heat processing period H, and inputs the selected temperature(s) into the input part 121 of the control unit 101 (Step S1 in FIG. 12). Hereinafter, a case in which the temperature during the temperature fluctuation period $H_1$ and the temperature during the temperature steady period $H_2$ are selected will be described as an example. Upon selection by the user of the adjustment object, the temperature measuring wafer 110 is mounted on the heating plate 63, and the temperature of the temperature measuring wafer 110 in the heat processing period H from immediately after the mounting to the time when the same time period as the heat processing time elapses is measured (Step S2 in FIG. 12). Upon measurement of the temperature of the temperature measuring wafer 110, the temperature data during the temperature fluctuation period $H_1$ and during the temperature steady period $H_2$ are inputted into the control unit 101 and stored in the data storage part 122, for example, for each of the wafer regions 110a to 110e by the temperature data acquisition program P1 (Step S3 in FIG. 12). Next, by the determination program P2, whether the uniformity among the wafer regions 110a to 110e in temperature during the temperature fluctuation period $H_1$ and the temperature steady period $H_2$ is allowable or not is determined (Step S4 in FIG. 12). This determination is made by comparing the maximum temperature difference among the wafer regions to a threshold value which has been set in advance, so that if the maximum temperature difference exceeds the threshold value, the temperatures are determined to be nonuniform, and if the maximum temperature difference does not exceed the threshold value, the temperatures are determined to be uniform.

Figure 13:
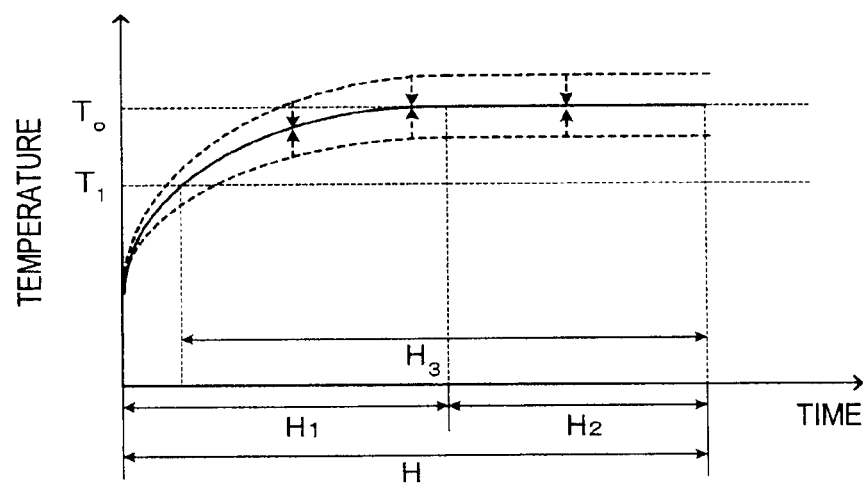
FIG. 13 A graph showing a wafer temperature during heat processing for explaining an appearance in which fluctuations in temperature are modified.

If the temperatures of the wafer regions 110a to 110e are determined to be uniform, the temperature setting process is finished. If the temperatures are determined to be nonuniform, the correction values for the temperature setting parameters a and b for the temperatures during the temperature fluctuation period $H_1$ and the temperature steady period $H_2$ are calculated using the correction value calculation model M by the correction value calculation program P3 (Step P5 in FIG. 12). After the correction values are calculated, the correction values are outputted, for example, to the heater controller 67, and the existing values of the temperature setting parameters a and b are changed by the temperature setting parameter change program P4 (Step S6 in FIG. 12). Thus, the temperature settings in the regions 63a to 63e in the heat processing period H for the wafer W are adjusted, so that the temperatures during the temperature fluctuation period $H_1$ and the temperature steady period $H_2$ which have varied within the wafer are made uniform, for example, as shown in FIG. 13.

After the temperature setting parameters are changed, temperature measurement by the temperature measuring wafer 110 is performed again, and whether the uniformity among the wafer regions 110a to 110e in temperature during the temperature fluctuation period $H_1$ and the temperature steady period $H_2$ is allowable or not is determined, so that whether or not the temperature is uniform within the wafer is verified. If the temperature is uniform within the wafer, the temperature setting process is finished. If the temperature is not uniform, the correction values for the temperature setting parameters are calculated again, and the temperature setting parameters are changed. This process is repeated a predetermined number of times or more, and if the temperature still does not become uniform within the wafer, the data contents of the correction value calculation model M is modified, for example, by the model modification program P5 (Step S7 in FIG. 12).

According to the above embodiment, the temperatures within the wafer in the actual heat processing period H are precisely made uniform, so that the heat-processing can be performed uniformly within the wafer. In addition, since the temperature during the temperature fluctuation period $H_1$, the temperature during the temperature steady period $H_2$, or the accumulated temperature during the reaction period $H_3$ in the heat processing period H, or the accumulated reaction temperature in the heat processing period H can be selected as the adjustment contents of the temperature setting, the setting of the temperature affecting the processing result can be adjusted as required. Note that although the settings of the temperature during the temperature fluctuation period $H_1$ and the temperature during the temperature steady period $H_2$ in the heat processing period H are adjusted in the above embodiment, the settings of all of the temperatures including the accumulated temperature during the reaction period $H_3$ and the accumulated reaction temperature in the heat processing period H may be adjusted, or any of them may be adjusted.

Although the temperatures within the wafer during the heat processing are measured using the temperature measuring wafer 110 in the above embodiment, temperatures at the periphery of the wafer W on the heating plate 63 may be measured in the PEB unit 44, and the temperatures within the wafer in the heat processing time may be estimated from the peripheral temperatures. As the peripheral temperatures of the wafer W, the temperatures of the heating plate 63 may be measured. In this case, the program storage part 124 of the control unit 101 stores a temperature estimation program to estimate the temperatures of the wafer W mounted on the heating plate 63 from the temperatures of the heating plate 63 itself. The temperature estimation program can estimate the temperature of the wafer W based on the correlation data between the temperature of the heating plate 63 which has been obtained in advance and the temperature of the wafer W.

At the time of setting the temperature of the heating plate 63, the temperatures of the regions 63*a* to 63*e* measured by the temperature sensors 66 of the heating plate 63 are inputted from the heater controller 67 to the control unit 101 and stored into the data storage part 122 by the temperature data acquisition program P1. The temperatures of the regions within the wafer are then estimated by the temperature estimation program. Thereafter, as in the above embodiment, whether the uniformity in temperature within the wafer is allowable or not is determined, and if the determination is negative, a correction value for a predetermined temperature setting parameter is calculated, and the temperature setting parameter is changed. According to this example, the temperature setting of the heating plate 63 can be performed using the existing temperature sensors 66 in the PEB unit 44 without using the temperature measuring wafer 110.

Figure 14:
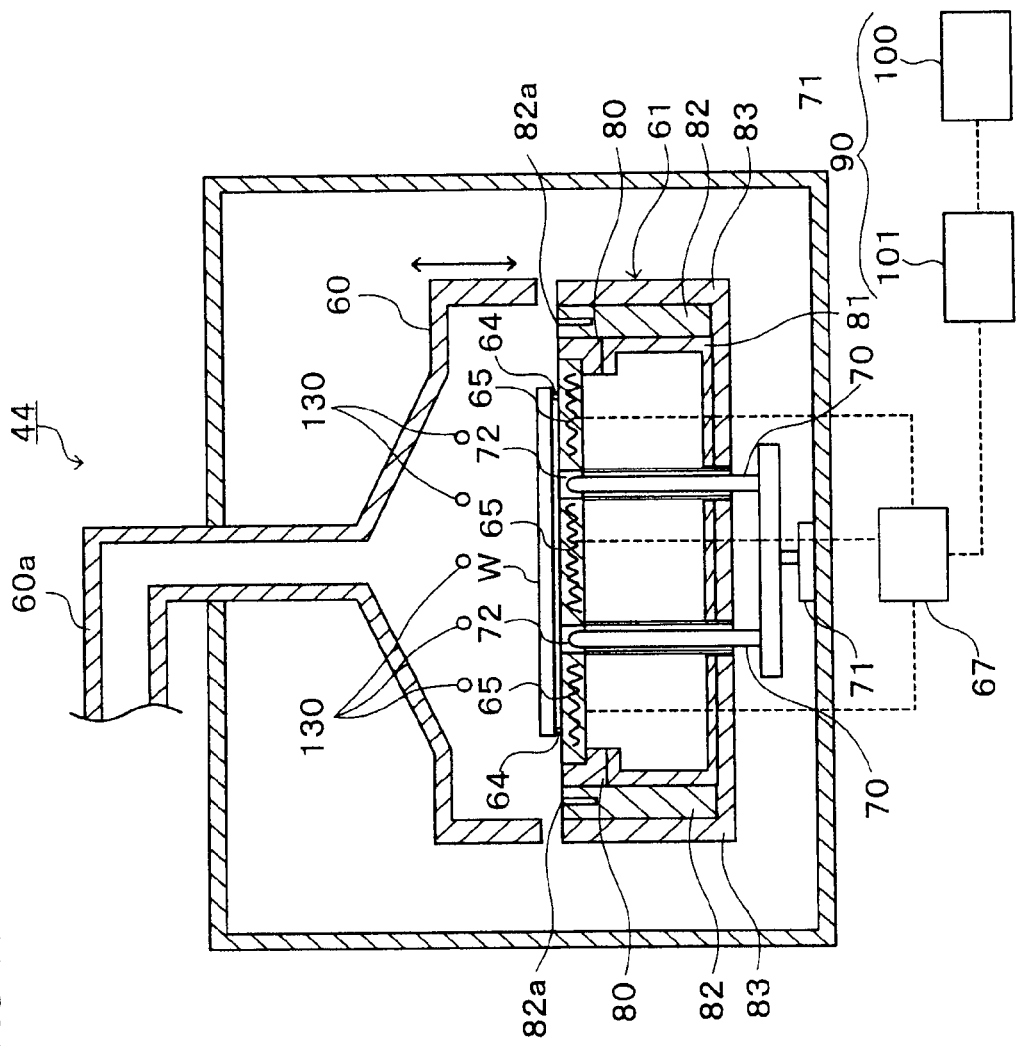
FIG. 14 An explanatory view of a longitudinal section showing the outline of a configuration of the PEB unit including temperature sensors in a processing chamber.
Figure 15:
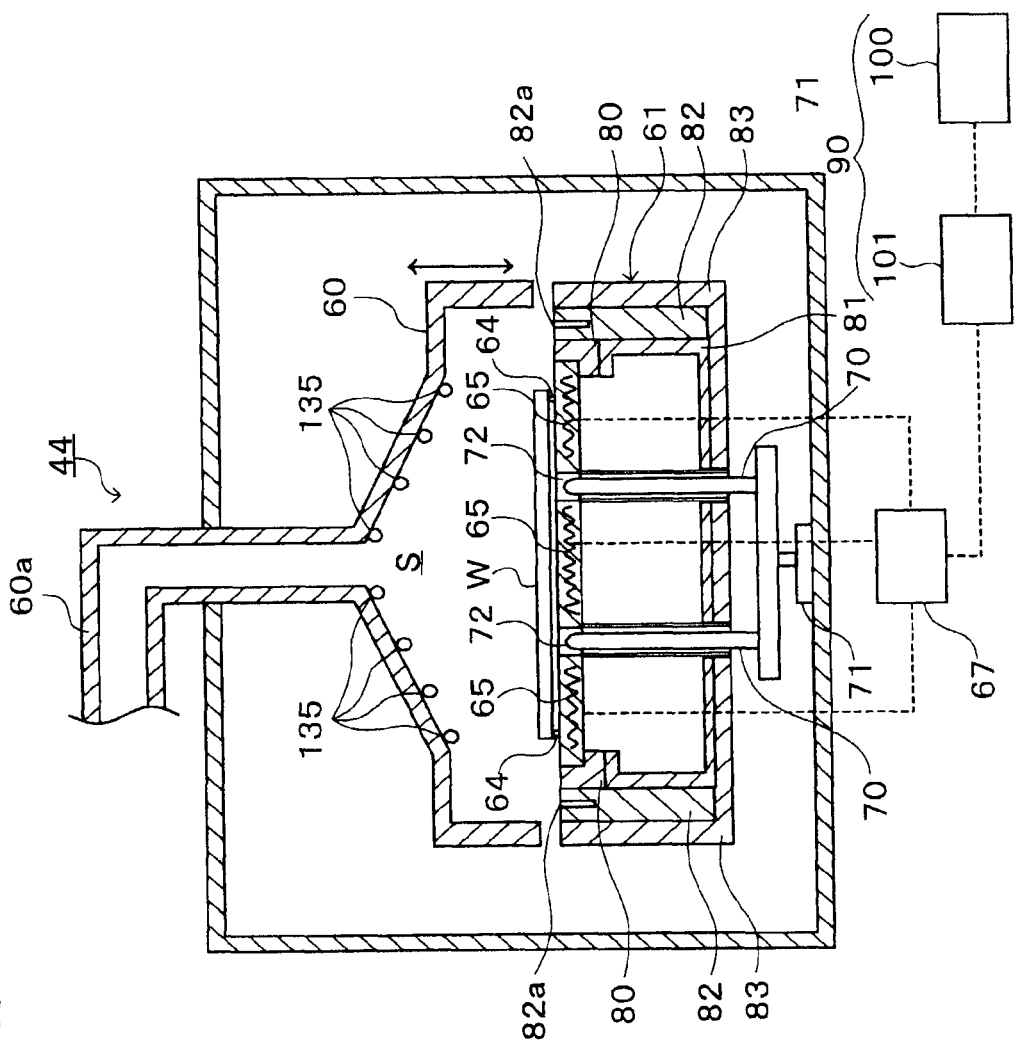
FIG. 15 An explanatory view of a longitudinal section showing the outline of a configuration of the PEB unit in which temperature sensors are arranged on a lid body.

It should be noted that temperatures of an atmosphere at the periphery of the wafer W mounted on the heating plate 63 may be used as the peripheral temperatures of the wafer W. In this case, a plurality of temperature sensors 130 are arranged above the wafer W in the processing chamber S as shown in FIG. 14 to measure the temperatures of the atmosphere at the periphery of the wafer W so that the temperatures of the wafer W may be estimated from the atmosphere temperatures. Besides, temperatures of a peripheral member of the wafer W mounted on the heating plate 63 may be used as the peripheral temperatures of the wafer W. In this case, a plurality of temperature sensors 135 may be arranged on the lid body 60 located above the wafer W on the heating plate 63, for example, as shown in FIG. 15 to measure the temperatures of the lid body 60 close to the wafer W, so that the temperatures of the wafer W may be estimated from the temperatures of the lid body 60. Note that instead of the lid body 60, for example, the support member 80 or the support table 81 of the heating plate accommodating unit 61 may be used as the peripheral member of the wafer W.

Figure 16:
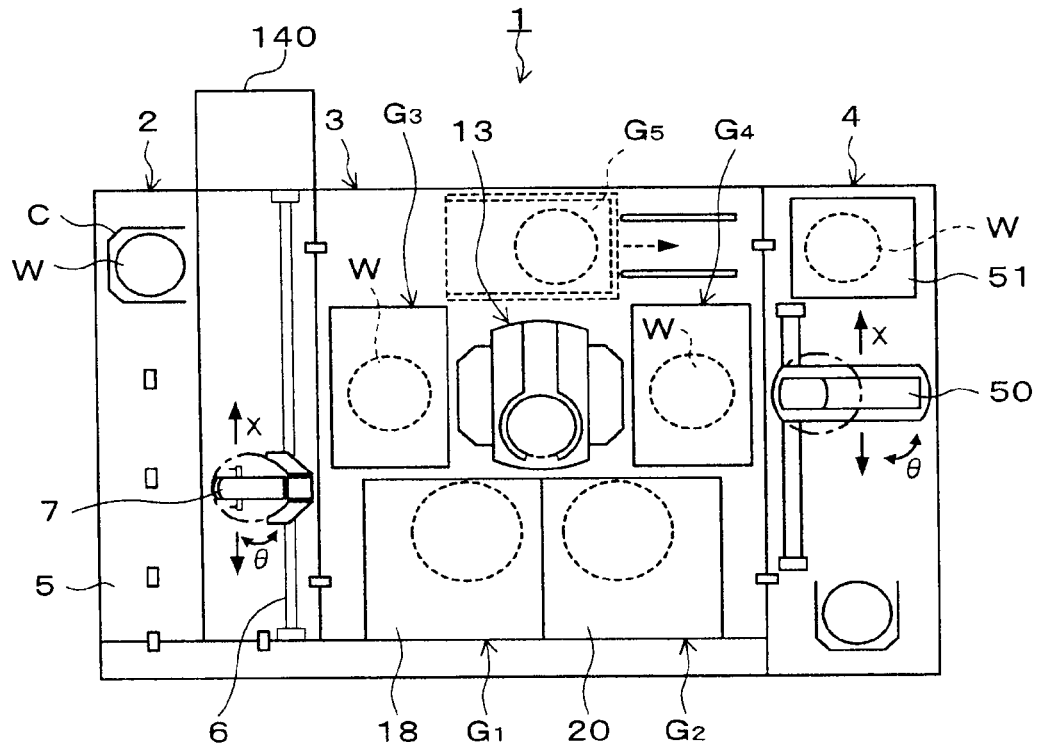
FIG. 16 A plan view of a coating and developing treatment system including a line width measuring unit.

Although whether the uniformity in temperature within the wafer during the heat processing is allowable or not is determined from the temperatures measured by the temperature measuring wafer 110 in the above embodiment, the uniformity in temperature within the wafer is allowable or not may be determined based on the processing result of the wafer W. For example, the line width of the resist pattern formed on the wafer W by the photolithography process may be used as the processing result of the wafer W. In this case, a line width measuring unit 140 for measuring the line width on the wafer W is provided on the rear side of the cassette station 2 of the coating and developing treatment system 1, for example, as shown in FIG. 16. Note that the line width measuring unit 140 may be provided outside the coating and developing treatment system 1.

Figure 17:
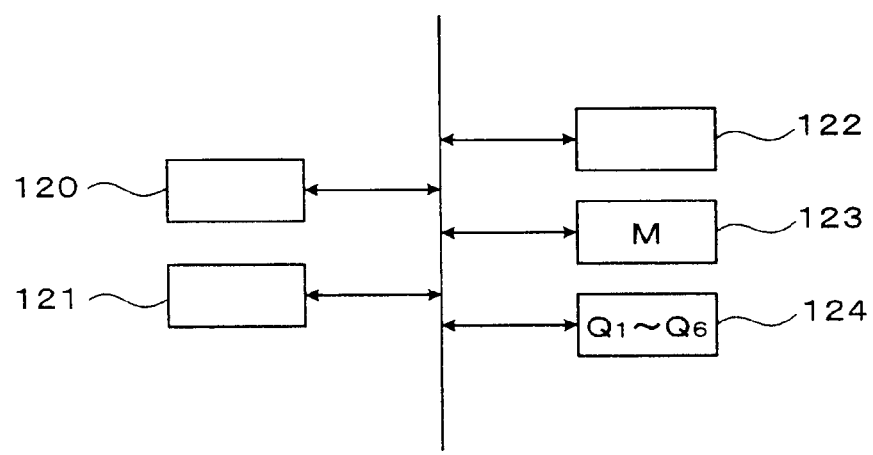
FIG. 17 A block diagram showing another configuration example of the control unit.

For example, as shown in FIG. 17, the program storage part 124 of the control unit 101 stores a line width data acquisition program Q1 to acquire line width data of the divided regions within the wafer from the line width measuring unit 140 and store the data into the data storage part 122; a conversion program Q2 to convert the line width data in the data storage part 122 into the temperature of the wafer W during the heat processing; a determination program Q3 to determine whether the uniformity in temperature within the wafer is allowable or not based on the converted temperature data; a correction value calculation program Q4 to calculate the correction value for the temperature setting parameter for the heating processing 63 using the correction value calculation model M when the determination by the determination program Q3 is a negative determination; a temperature setting parameter change program Q5 to change the temperature setting parameter in the heater controller 67 based on the correction value; and a correction value calculation model modification program Q6 to modify the correction value calculation model M when the uniformity in temperature within the wafer is not improved even though the temperature setting parameter is changed. Note that the conversion by the conversion program Q2 is performed using the correlation data between the line width on the wafer W after completion of the photolithography process which has been obtained in advance and the wafer temperature in the heat processing time.

At the time of setting the temperatures of the heating plate 63, the wafer W for which the photolithography process has been finished in the coating and developing treatment system 1 is transferred to the line width measuring unit 140, and the line width of the pattern formed on the wafer W is measured. The measurement result is inputted into the control unit 101 by the line width data acquisition program Q1. Subsequently, the line width result is converted into the temperatures of the wafer W in the heat processing time by the conversion program Q2. Hereinafter, as in the above embodiment, whether the uniformity in temperature within the wafer is allowable or not is determined by the determination program Q3, and if the determination is a negative determination, a correction value for a temperature setting parameter of the heating plate 63 is calculated using the correction value calculation model M by the correction value calculation program Q4, and the predetermined temperature setting parameter is changed by the temperature setting parameter change program Q5. According to this example, the uniformity in temperature within the wafer in the heat processing time is evaluated based on the line width formed on the wafer W, so that the line width within the wafer can be finally made uniform.

Note that in the above example, the temperature during the temperature steady period $H_2$ and the accumulated temperature during the reaction period $H_3$ out of the temperatures of the wafer W in the heat processing time can be estimated from the measured line width. Accordingly, it may be adoptable to allow for selection of at least any of the temperature during the temperature steady period $H_2$, the accumulated temperature during the reaction period $H_3$, and the accumulated reaction temperature in the heat processing period H, determine whether the uniformity in the selected temperature within the wafer is allowable or not, and change the temperature setting parameter corresponding to the selected temperature if the temperature is nonuniform in the above example.

Although the line width of the pattern formed on the wafer W is used as the processing result of the wafer W in the above example, other processing results, for example, the film thickness of a film formed on the wafer W may be used.

Incidentally, when the temperature measuring wafer 110 capable of transmission by wireless is used for the temperature measurement of the heating plate, the temperature measuring wafer 110 is transferred, like a normal wafer W to be processed, from the cassette station 2 and transferred to a predetermined heat processing unit in the processing station 3 via the wafer transfer body 7 and the main transfer unit 13. In this event, since the install position and the install direction are different, for example, for each of the heat processing units in the processing station 3, the mounting direction of the temperature measuring wafer 110 on the heating plate, that is, the correspondence between wafer regions 110a to 110e of the temperature measuring wafer 110 and the regions of the heating plate is different for each of the heat processing units. Hence, the relation between a notch position of the temperature measuring wafer 110 when transferred into the cassette station 2 and a notch position of the temperature measuring wafer 110 when mounted on the heating plate in each of the heat processing units is obtained in advance, and this notch position information is stored, for example, in the control unit 101 of the temperature measuring unit 100. At the time of performing the temperature setting of the heating plate, for example, the correction value calculation model M calculates the correction value for the temperature setting parameter for each of the regions of the heating plate taking the notch position information into consideration. This makes it possible to appropriately perform correction of the temperature setting of each of the regions of the heating plate based on the temperature measurement even when using the temperature measuring wafer 110 capable of transmission by wireless. Note that although the notch position information has been obtained in advance in the above example, the notch position may be detected by a sensor when the temperature measuring wafer 110 is transferred into the cassette station 2, and the notch position in the heat processing unit that is the transfer destination may be automatically calculated based on the detection information, so that the information may be stored as the notch position information.

While examples of a preferred embodiment of the present invention have been described above, the present invention is not limited to those examples but can take various forms. For example, the heating plate 63 described in the embodiment is divided into five regions, and the number of divided regions can be arbitrarily selected. Further, while the embodiment is for a case of setting the temperature of the heating plate 63 in the PEB unit 44, the present invention is also applicable to other heat processing units such as a pre-baking unit and a post-baking unit including a heating plate and to a cooling processing unit including a cooling plate for mounting and cooling the wafer W thereon. Further, the present invention is also applicable to a heat processing unit for a substrate other than the wafer, such as an FPD (Flat Panel Display), a mask reticle for a photomask, and the like.

INDUSTRIAL APPLICABILITY

The present invention is useful in setting the temperature of a heat processing plate so that the substrate is uniformly heat-processed.

What is claimed:

1. A temperature setting method of a heat processing plate for mounting and heat-processing a substrate thereon,
the heat processing plate being divided into a plurality of regions and temperature-settable for each of the regions, said method comprising:
a first step of mounting on the heat processing plate a temperature measuring substrate having a same shape as a shape of the substrate and simulatively measuring a temperature of the substrate to be mounted on the heat processing plate in a heat processing time; and
a second step of setting temperatures of the regions of the heat processing plate based on a result of the temperature measurement so that the temperature within the substrate is kept uniform during a heat processing period from the time when the substrate is mounted on the heat processing plate to the time when a predetermined heat processing time elapses in an actual heat processing time,
wherein the temperatures of the regions of the heat processing plate are set so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

2. A temperature setting method of a heat processing plate for mounting and heat-processing a substrate thereon,
the heat processing plate being divided into a plurality of regions and temperature-settable for each of the regions, said method comprising:
a first step of measuring a temperature at a periphery of the substrate mounted on the heat processing plate and estimating a temperature of the substrate to be mounted on the heat processing plate in a heat processing time; and
a second step of setting temperatures of the regions of the heat processing plate based on a result of the temperature estimation so that the temperature within the substrate is kept uniform during a heat processing period from the time when the substrate is mounted on the heat processing plate to the time when a predetermined heat processing time elapses in an actual heat processing time,
wherein the temperatures of the regions of the heat processing plate are set so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

3. The temperature setting method of a heat processing plate as set forth in claim 2,
wherein the temperature at the periphery of the substrate is a temperature of each of the regions of the heat processing plate.

4. The temperature setting method of a heat processing plate as set forth in claim 2,
wherein the temperature at the periphery of the substrate is a temperature of an atmosphere at the periphery of the substrate on the heat processing plate.

5. The temperature setting method of a heat processing plate as set forth in claim 2,
wherein the temperature at the periphery of the substrate is a temperature of a member at the periphery of the substrate on the heat processing plate.

6. The temperature setting method of a heat processing plate as set forth in claim 2,
wherein the temperatures of the regions of the heat processing plate are set so that any one or more of a temperature during an initial temperature fluctuation period, a temperature during a temperature steady period after the temperature fluctuation period, and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate.

7. A temperature setting apparatus of a heat processing plate for mounting and heat-processing a substrate thereon,
said heat processing plate being divided into a plurality of regions and temperature-settable for each of the regions, said apparatus comprising:
a temperature measuring substrate having a same shape as a shape of the substrate, for being mounted on said heat processing plate and simulatively measuring a temperature of the substrate to be mounted on said heat processing plate in a heat processing time; and
a control unit for setting temperatures of the regions of said heat processing plate based on a result of the temperature measurement by said temperature measuring substrate so that the temperature within the substrate is kept uniform during a heat processing period from the time when the substrate is mounted on said heat processing plate to the time when a predetermined heat processing time elapses in an actual heat processing time,
wherein said control unit sets the temperatures of the regions of said heat processing plate so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

8. A temperature setting apparatus of a heat processing plate for mounting and heat-processing a substrate thereon,
said heat processing plate being divided into a plurality of regions and temperature-settable for each of the regions, said apparatus comprising:
a temperature sensor for measuring a temperature at a periphery of the substrate mounted on said heat processing plate; and
a control unit for estimating a temperature of the substrate to be mounted on said heat processing plate in a heat processing time from a result of the temperature measurement by said temperature sensor, and setting temperatures of the regions of said heat processing plate based on a result of the temperature estimation so that the temperature within the substrate is kept uniform during a heat processing period from the time when the substrate is mounted on said heat processing plate to the time when a predetermined heat processing time elapses in an actual heat processing time,
wherein said control unit sets the temperatures of the regions of said heat processing plate so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

9. The temperature setting apparatus of a heat processing plate as set forth in claim 8,
wherein said temperature sensor measures the temperature of each of the regions of said heat processing plate.

10. The temperature setting apparatus of a heat processing plate as set forth in claim 8,
wherein said temperature sensor measures a temperature of an atmosphere at the periphery of the substrate on said heat processing plate.

11. The temperature setting apparatus of a heat processing plate as set forth in claim 8,
wherein said temperature sensor measures a temperature of a member at the periphery of the substrate on said heat processing plate.

12. The temperature setting apparatus of a heat processing plate as set forth in claim 8,
wherein said control unit sets the temperatures of the regions of said heat processing plate so that any one or more of a temperature during an initial temperature fluctuation period, a temperature during a temperature steady period after the temperature fluctuation period, and an accumulated temperature during a predetermined period in the heat processing period, and an accumulated reaction temperature obtained by multiplying reaction factors of a film on the substrate by the substrate temperatures in the heat processing period and accumulating resulting temperatures, is/are kept uniform within the substrate.

13. A non-transitory computer-readable recording medium storing a program for causing a computer to realize a function of a control unit in a temperature setting apparatus of a heat processing plate for mounting and heat-processing a substrate thereon,
said heat processing plate being divided into a plurality of regions and being temperature-settable for each of the regions,
wherein said temperature setting apparatus further has a temperature measuring substrate having a same shape as a shape of the substrate, for being mounted on said heat processing plate and simulatively measuring a temperature of the substrate to be mounted on said heat processing plate in a heat processing time; and a control unit for setting temperatures of the regions of said heat processing plate based on a result of the temperature measurement by said temperature measuring substrate so that the temperature within the substrate is kept uniform during a heat processing period from the time when the substrate is mounted on said heat processing plate to the time when a predetermined heat processing time elapses in an actual heat processing time,
wherein said control unit sets the temperatures of the regions of said heat processing plate so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

14. A non-transitory computer-readable recording medium storing a program for causing a computer to realize a function of a control unit in a temperature setting apparatus of a heat processing plate for mounting and heat-processing a substrate thereon,
said heat processing plate being divided into a plurality of regions and temperature-settable for each of the regions,
wherein said temperature setting apparatus further has a temperature sensor for measuring a temperature at a periphery of the substrate mounted on said heat processing plate; and a control unit for estimating a temperature of the substrate to be mounted on said heat processing plate in a heat processing time from a result of the temperature measurement by said temperature sensor, and setting temperatures of the regions of said heat processing plate based on a result of the temperature estimation so that the temperature within the substrate is kept uniform during a heat processing period from the time when the substrate is mounted on said heat processing plate to the time when a predetermined heat processing time elapses in an actual heat processing time,
wherein said control unit sets the temperatures of the regions of said heat processing plate so that any one or more of an accumulated temperature during a period when a temperature to cause a chemical reaction in a film on a substrate is exceeded in the heat processing period, and an accumulated reaction temperature obtained by multiplying reaction factors of a film on the substrate by the substrate temperatures in the heat processing period and accumulating resulting temperatures, is/are kept uniform within the substrate.

* * * * *